US008119525B2

(12) United States Patent
Yu et al.

(10) Patent No.: US 8,119,525 B2
(45) Date of Patent: Feb. 21, 2012

(54) PROCESS FOR SELECTIVE GROWTH OF FILMS DURING ECP PLATING

(75) Inventors: Jick M. Yu, San Jose, CA (US); Wei D. Wang, San Jose, CA (US); Rongjun Wang, Cupertino, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 422 days.

(21) Appl. No.: 12/037,578

(22) Filed: Feb. 26, 2008

(65) Prior Publication Data

US 2009/0215264 A1 Aug. 27, 2009

(51) Int. Cl.
*H01L 21/44* (2006.01)

(52) U.S. Cl. ........ 438/674; 438/675; 438/677; 438/686; 438/687; 438/688; 438/641; 257/E21.586; 257/E21.587

(58) Field of Classification Search .................. 438/641, 438/674, 675, 677, 686–688; 257/E21.586, 257/E21.587
See application file for complete search history.

(56) References Cited

U.S. PATENT DOCUMENTS

| 6,368,484 | B1 | 4/2002 | Volant et al. |
| 6,420,258 | B1 | 7/2002 | Chen et al. |
| 6,511,912 | B1 | 1/2003 | Chopra et al. |
| 6,638,688 | B2 | 10/2003 | Ching et al. |
| 7,051,934 | B2 | 5/2006 | Lee et al. |
| 7,060,624 | B2 | 6/2006 | Andricacos et al. |
| 7,190,079 | B2 | 3/2007 | Andricacos et al. |
| 7,198,705 | B2 | 4/2007 | Chen et al. |
| 7,229,889 | B2 | 6/2007 | Holmes et al. |
| 7,363,705 | B2 | 4/2008 | Kim et al. |
| 7,405,163 | B1 | 7/2008 | Drewery et al. |
| 2006/0258144 | A1 | 11/2006 | Choi et al. |
| 2008/0000777 | A1 | 1/2008 | Barrese et al. |
| 2008/0029400 | A1 | 2/2008 | Mazur |
| 2008/0057709 | A1 | 3/2008 | Vasilev |
| 2008/0121343 | A1 | 5/2008 | Cohen et al. |
| 2008/0230391 | A1 | 9/2008 | Lockard et al. |

FOREIGN PATENT DOCUMENTS

| JP | 2000340565 A | 12/2000 |
| KR | 20000034526 A | 6/2000 |
| KR | 20010004718 A | 1/2001 |
| KR | 20050068580 A | 7/2005 |

OTHER PUBLICATIONS

International Search Report and Written Opinion of the International Searching Authority, Dated Jul. 22, 2009, International Application No. PCT/US2009/033673.

*Primary Examiner* — David Zarneke
(74) *Attorney, Agent, or Firm* — Patterson & Sheridan, L.L.P.

(57) ABSTRACT

Methods of controlling deposition of metal on field regions of a substrate in an electroplating process are provided. In one aspect, a dielectric layer is deposited under plasma on the field region of a patterned substrate, leaving a conductive surface exposed in the openings. Electroplating on the field region is reduced or eliminated, resulting in void-free features and minimal excess plating. In another aspect, a resistive layer, which may be a metal, is used in place of the dielectric. In a further aspect, the surface of the conductive field region is modified to change its chemical potential relative to the sidewalls and bottoms of the openings.

20 Claims, 8 Drawing Sheets

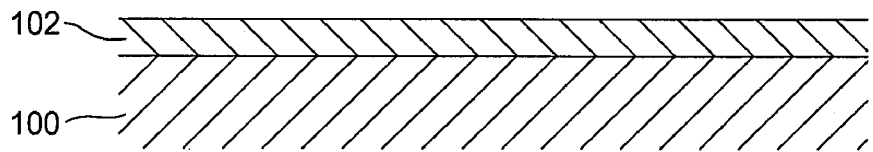
FIG. 1A
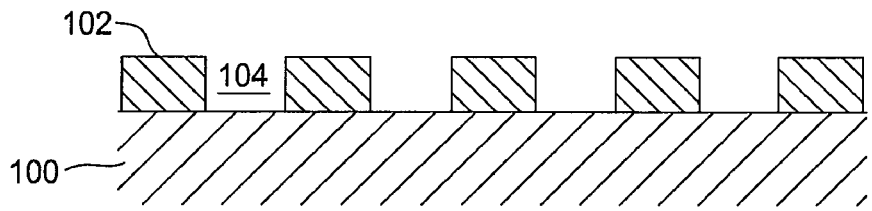
FIG. 1B
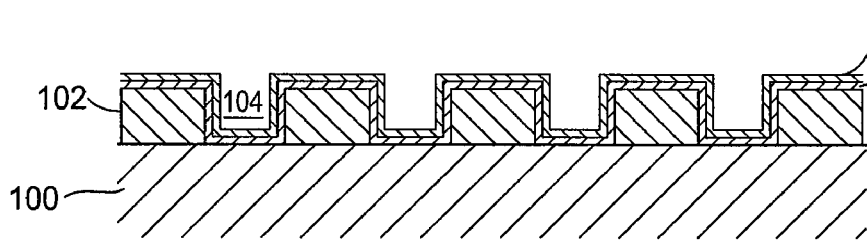
FIG. 1C
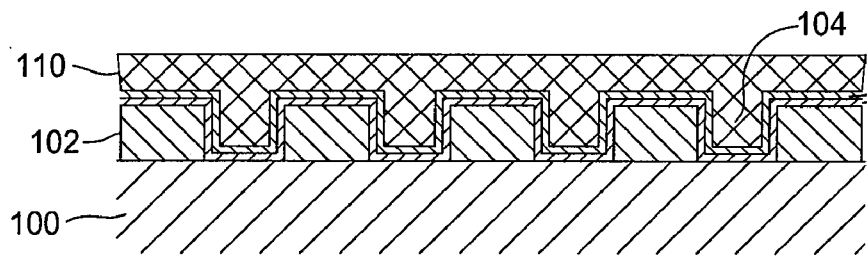
FIG. 1D
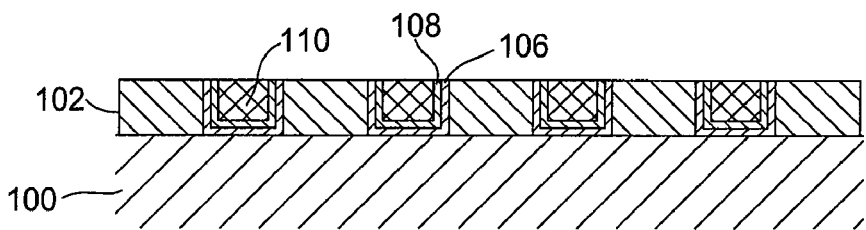
FIG. 1E
FIG. 1
(PRIOR ART)
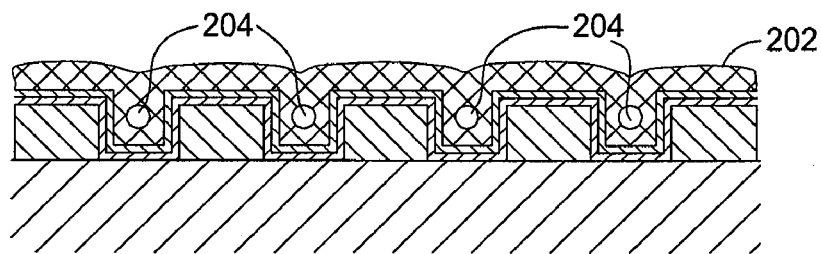
FIG. 2
(PRIOR ART)

PROCESS FOR SELECTIVE GROWTH OF FILMS DURING ECP PLATING

BACKGROUND OF THE INVENTION

1. Field of the Invention

Embodiments of the present invention generally relate to methods for filling openings in a substrate with metal. Specifically, methods for pre-treating the substrate prior to filling openings are provided.

2. Description of the Related Art

Reliably producing nanometer-sized features is one of the key technologies for the next generation of semiconductor devices. The shrinking dimensions of circuits and devices have placed increased demands on processing capabilities. The multilevel interconnects that lie at the heart of integrated circuit technology require precise processing of high aspect ratio features, such as vias and other interconnects. Reliable formation of these interconnects is very important to future success and to the continued effort to increase circuit density and quality of individual substrates. Also, in some processes, openings in a field region of a substrate must be filled with metal to form contacts for a chip package. All such features must be formed substantially without embedded voids or spaces. Voids inhibit the electrical properties of the features, reducing the reliability of the device.

Metallization of openings, such as trenches or holes, formed on substrates has conventionally focused on various plating processes, including electroplating. A substrate having openings to be filled with metal is exposed to an electrolyte solution while a voltage bias is applied. Electrolyte reacts with the biased substrate to deposit metal. FIG. 1 illustrates a substrate in various stages of such an electroplating process. In FIG. 1A, a substrate comprises a first layer 100 and a second layer 102. In FIG. 1B, the second layer 102 is patterned to create openings 104, exposing the first layer 100. If the first layer 100 is conductive, metal may be directly deposited in the openings 104. If both the first and second layers, 100 and 102, respectively, are non-conductive, a conductive layer must be added to facilitate electroplating. FIG. 1C illustrates a substrate with the non-conductive layers 100 and 102, and openings 104. A barrier layer 106 and a conductive seed layer 108 have been formed over the substrate. The barrier layer 106 prevents conductive species from the seed layer 108 from migrating into the non-conductive layers 102 and 104. The conductive seed layer 108 allows electroplating to proceed, as shown in FIG. 1D, where a conductive layer 110 has been formed, overfilling the openings 104. The process is complete with planarization in FIG. 1E to remove excess conductor, seed, and barrier layer, exposing the non-conductive second layer 102.

Currently, copper and copper alloys have become the metals of choice over aluminum for nanometer-sized interconnect technology, as well as for contact formation in chip packaging processes. Copper has a lower electrical resistivity (about 1.7 $\mu\Omega$-cm compared to about 2.7 $\mu\Omega$-cm for aluminum), a higher current carrying capacity, and significantly higher electromigration resistance than aluminum. These characteristics are important for supporting the higher current densities experienced at high levels of integration and increased device speed. Further, copper has good thermal conductivity and is available in a highly pure form.

In a typical electroplating process such as that illustrated by FIG. 1, metal is deposited on the field region as well as on the sidewalls and bottoms of the openings. As metal grows on the field and sidewalls, the openings get smaller. Due to characteristics of processes such as PVD sputtering commonly used to form seed layers, a slight overhang generally develops near the tops of the openings. As metal deposition proceeds, overhang from one side of an opening grows to meet overhang from the other side, blocking any further access to the opening by the electrolyte solution. In this way, a void or space forms in the metalized feature. FIG. 2 illustrates a substrate after a typical electrochemical deposition process. Metal layer 202 has been deposited having voids 204 therein. The voids 204 reduce the electrical performance of the resulting contacts.

Moreover, substantial excess metal is used in today's common electroplating processes. The substrate shown in FIG. 2 must be planarized following deposition, and all the excess metal of layer 202 is discarded. In contact formation applications for chip packaging, the openings to be filled may be as large as 100 micrometers ($\mu$m) wide. Filling such openings with 100 $\mu$m of metal using the standard process nominally requires that 100 $\mu$m of metal be deposited on field regions as well, metal which is subsequently discarded.

Thus, there remains a need for a method of filling openings with conductive material in an electroplating process, while limiting deposition on field regions.

SUMMARY OF THE INVENTION

Embodiments of the present invention generally provide methods of treating a substrate to control deposition on the field region of a patterned substrate in an electroplating process by reducing the initial rate of electroplating on the field region.

In one aspect, embodiments of the invention provide a method of processing a patterned substrate having a field region and openings in the field region, comprising forming a conductive seed layer on the field regions and openings, forming one or more dielectric layers in the presence of RF power on portions of the conductive seed layer formed on the field region, and depositing a conductive material on the conductive seed layer in at least some of the openings by an electroplating process.

In another aspect, embodiments of the invention provide a method of processing a substrate having openings and field regions, comprising depositing a barrier layer over the openings and field regions, depositing a seed layer over the openings and field regions, forming a resistive layer on the portion of the seed layer deposited over the field regions, filling the openings with a conductive material by an electroplating process, and planarizing the substrate.

In another aspect, embodiments of the invention provide a method of filling one or more openings formed in a field region of a substrate with a conductive material, comprising forming a conductive layer over the openings and field region, depositing an insulating layer on the field region in the presence of RF power, removing a portion of the insulating layer, filling at least a portion of the one or more openings with conductive material by exposing at least a portion of the substrate to an electrolyte solution, and planarizing the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a side view of a substrate in various stages of a prior art process.

FIG. 2 is a side view of a substrate treated according to a prior art process.

DETAILED DESCRIPTION

Figure 3:
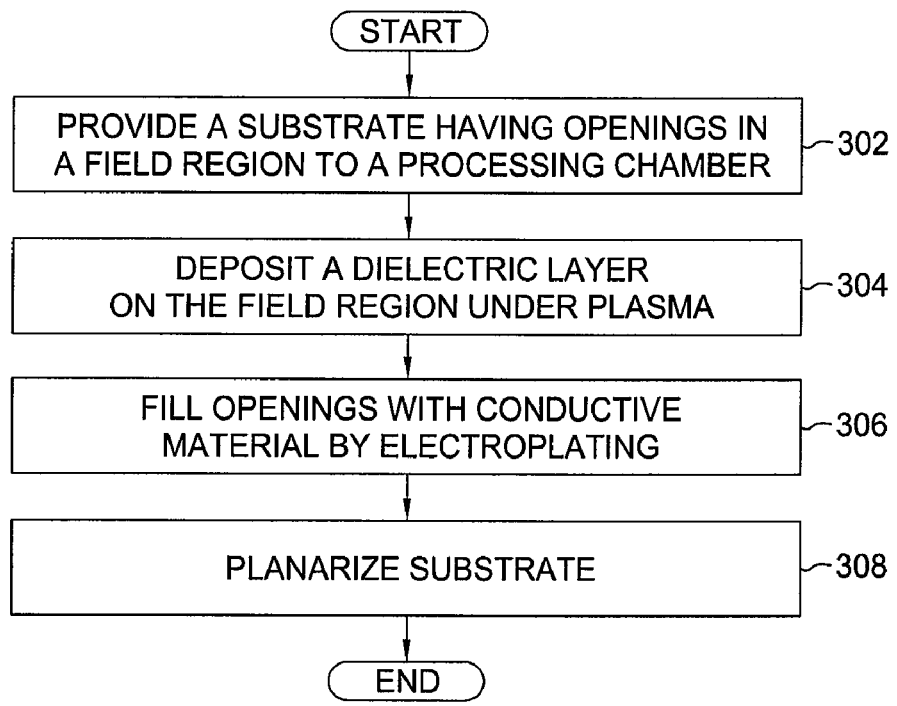
FIG. 3 is a process flow diagram according to one embodiment of the invention.

Embodiments of the present invention provide methods for selective electroplating of conductive materials on a substrate. Methods provided by embodiments of this invention enable preferential electroplating in openings formed on a substrate while slowing or preventing plating on field regions. Processes selective for field regions rather than openings are used to reduce plating on the field regions by modifying the surface of the substrate in the field regions or covering them with a dielectric or resistive material.

In a first aspect, embodiments of the invention provide a method of processing a substrate, comprising forming one or more openings in field regions on a surface of the substrate, forming one or more dielectric layers over at least a portion of the field regions in the presence of RF power, and depositing a conductive material in at least some of the features by an electroplating process. A substrate comprising a conductive or semi-conductive material, such as silicon, may be patterned to produce openings, such as trenches or holes, in the field regions corresponding to the space between the openings. The process for patterning the substrate may be any suitable process known to the art, such as photolithography, plasma etching, laser etching, and the like. In one embodiment, narrow trenches less than about 100 nanometers (nm) in width may be formed in a surface of the substrate. In another embodiment, wide holes up to 0.3 millimeters (mm) in width may be formed in a surface of the substrate. Trenches such as the narrow trenches described above may be used for creating circuit elements in integrated circuit devices. Holes such as the wide holes described above may be used to create metal contacts for chip packaging applications. Narrow trenches may have high aspect ratio geometry, for example higher than about 4:1. It is desired that these features be filled with a conductive material. In most cases, plating processes such as electroplating are chosen for filling features because relatively large quantities of conductive material can be deposited in a short time.

In some embodiments, a layer of dielectric material is formed over the field regions of the patterned surface of the substrate to facilitate reliable filling of openings. Forming such a dielectric layer over only the field regions suppresses electrochemical deposition on the field regions while allowing it to proceed in the openings. This enables selective plating in the openings. The dielectric layer is formed by a process that is selective to the field regions, and is generally formed over a conductive seed layer that facilitates initiation of electroplating. An example of such a process is a plasma-enhanced physical or chemical deposition process.

In some embodiments, a target comprising a conductor or semiconductor, is bombarded by ions from a reactive plasma in a vacuum to deposit a dielectric layer on a substrate. Particles ejected from the target by collision with the high-energy ions react with the ions and deposit preferentially on field regions of the substrate. Precursors selected from the group comprising oxygen compounds, nitrogen compounds, and carbon compounds may be provided to a processing chamber in a gas mixture. The mixture may further comprise a carrier gas, which is generally non-reactive. Carrier gases such as argon (Ar), helium (He), xenon (Xe), and neon (Ne) are commonly used. The plasma is generated by ionizing the gas mixture, either remotely or in situ, using inductive means, such as an inductive core disposed about a recirculation tube, or capacitative means, such as parallel electrodes. The pressure in the reaction chamber will generally be less than about 100 milliTorr (mTorr), preferably less than about 10 mTorr, such as about 4 mTorr.

The precursors react with the liberated conductor or semiconductor to form a dielectric material that deposits preferentially on the field regions of the substrate. The dielectric materials may be non-conducting oxides, such as silicon, aluminum, or titanium oxides ($SiO_x$, $AlO_y$, $TiO_z$, wherein x is between about 1.5 to about 2.5, y is between about 1.3 to about 1.7, and z is between about 0.8 to about 1.8) or non-conducting nitrides such as silicon, aluminum, or titanium nitrides (SiN, SiON, SiOCN, SiCN, SiC, AlN, TiN, etc.). The dielectric layer is preferably deposited to a thickness less than about 100 nm, more preferably less than about 10 nm, such as about 1 nm. Due to the affinity of the ejected particles for the substrate surface, the particles will deposit preferentially on the high altitude field regions of the substrate, with little deposition inside openings on side walls and on the bottom.

In other embodiments, a target comprising a resistive material or a dielectric material such as those described above may be bombarded by a plasma comprising a non-reactive gas, such as argon or helium, at low pressure to deposit a dielectric or resistive layer on the field regions of the substrate. Particles ejected from the target by collision with high-energy ions deposit a layer on the field regions of the substrate. The layer may be a resistive metal with higher resistivity than the underlying surface of the substrate, or a dielectric material. The resistive layer slows the initial rate of electroplating on the field regions, allowing the openings to fill without forming voids.

Following deposition of the dielectric or resistive layer, openings may be filled with conductive material by an electroplating process. The dielectric or resistive layer will retard initiation of electroplating on the field, reducing overhang growth and void formation in narrow features, and reducing excess plating on the field for all applications.

Figure 3A:
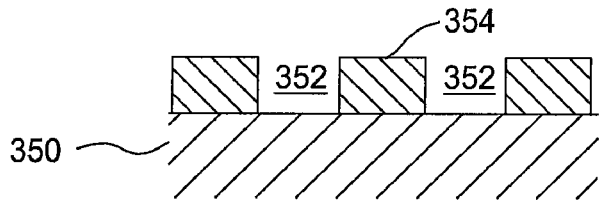
FIGS. 3A-3D are side views of a substrate in various stages of the process of FIG. 3.
Figure 3B:
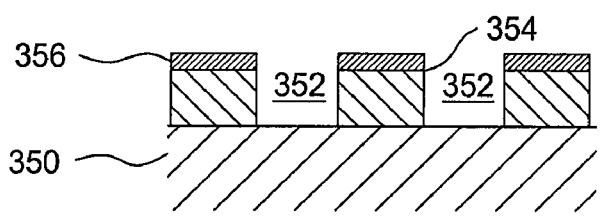

FIG. 3 is a process flow diagram illustrating a process 300 according to one embodiment of the invention. FIGS. 3A-3D illustrate a substrate in various stages of the process 300. A substrate having one or more openings in field regions is provided to a processing chamber in step 302. FIG. 3A depicts such a substrate 350 having openings 352 in field regions 354. Field regions 354, and sidewalls and bottoms of openings 352, generally need conductive surfaces to support electroplating. The substrate in FIG. 3A exhibits a low aspect ratio of approximately 1:1, but substrates with higher aspect ratios, such as higher than 4:1, can benefit from this process.

Substrates with deep openings of depth greater than about 1 µm may also benefit from this process.

A dielectric layer is deposited on the field regions 354, as described above, in step 304, shown schematically in FIG. 3B. In some embodiments, one or more chemical precursors are provided to a process chamber and ionized into a plasma by application of RF power to an inductive coil. The inductive coil may be disposed about a recirculation tube coupled to the process chamber. In one example, aluminum oxide may be deposited by application of between about 1000 watts and about 3000 watts, such as about 2000 watts, of RF power to an argon sputtering gas. The aluminum oxide may be contained in a sputtering target to which a voltage is applied to encourage the argon ions to bombard the target. Argon gas may be provided to a processing chamber at a flow rate about 10 standard cubic centimeters per second (sccm) to about 40 sccm, such as about 20 sccm, and the chamber operated at a pressure of less than about 100 mTorr, preferably less than about 10 mTorr, such as about 4 mTorr. Free target molecules thus generated deposit preferentially on the field region of the substrate. A dielectric layer about 10 to about 100 Angstroms thick may be deposited on the field regions of the substrate in this manner.

In another example, an aluminum target is subjected to a reactive plasma comprising a reactive gas and a carrier gas. The ratio of the reactive gas to the carrier gas may be from 0.5 to 5.0 by volume. Reactive gases may be oxygen compounds, such as oxygen gas, or nitrogen compounds, such as nitrogen gas or ammonia. The precursor plasma reacts with the aluminum target to deposit the dielectric layer 356 preferentially on the field regions 354 of the substrate. A thin dielectric layer less than 100 nm thick, even less than 1 nm thick, is effective to retard initiation of deposition on the field in an electroplating process. The dielectric layer will cover the conductive surfaces of the field region 354 completely while leaving the conductive surface exposed on sidewalls and bottoms of the openings 352. In some embodiments, the dielectric layer may be a non-conducting material. In other embodiments, a resistive layer may be used in place of the dielectric layer. The resistive layer may be a metal with electrical conductivity lower than that of the seed layer. Such metals may for example include titanium, tantalum, zinc, nickel, cobalt, tungsten, and indium.

Figure 3C:
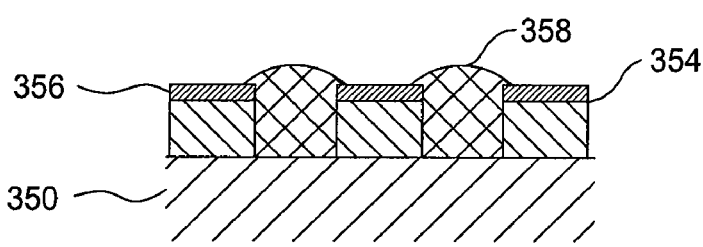
Figure 3D:
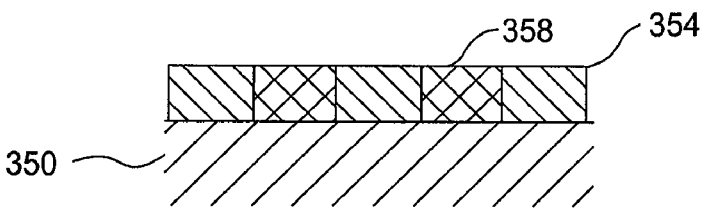

After the dielectric layer is deposited, the trenches 352 may be filled with a conductive material in an electroplating process, as described in step 306. FIG. 3C illustrates a substrate 350 with trenches 352 filled with conductive material 358. The substrate 350 is exposed to an electrolyte solution designed to deposit a conductor on a substrate when an electric potential is applied, and conductive material deposits on the exposed seed layer. Plating is diminished in areas with no exposed seed layer, such as the field regions 354 covered by the dielectric layer 356. In many cases, trenches will be overfilled, as depicted by the raised portions of the conductive material 358. When the openings are dense vias, such as vias separated by distances of less than 10 Angstroms, over-filling will result in a continuous layer of conductive material on the field regions, with the trenches or vias being filled thereby. In the case of non-dense vias, over-filling will result in raised portions, as depicted in FIG. 3C. In either case, the process is completed by a planarizing step 308, wherein the excess conductive material is removed, along with any dielectric, seed, and barrier layers on the field. This step may be completed by any suitable process known to the art, such as Chemical Mechanical Polishing (CMP), Electrochemical Mechanical Polishing (ECMP), or electrochemical planarization.

In some embodiments, a resistive material may be used in place of the dielectric material. The resistive material may be a metal with electrical conductivity lower than that of the seed layer. In other embodiments, a dielectric material may be selectively formed on the field regions by other processes. In one embodiment, a dielectric material may be formed by a plasma-enhanced chemical vapor deposition process. Precursors may be provided to a process chamber and reacted in the presence of RF power to deposit the dielectric material on a substrate disposed in the process chamber. A first precursor may be a metal precursor or a are deep and wide, such as openings for chip package contact formation that may be 10 µm wide, the barrier layer may be relatively thick, such as between about 50 to 100 nm. High aspect ratio geometry will generally require a thicker barrier layer because more surface area must be covered by barrier material.

In one example a tantalum barrier layer may be deposited conformally on a substrate having openings approximately 0.1 µm wide in a field region. Sputtering a tantalum target for less than 20 seconds in 10-20 sccm of argon with a target bias of 15 kW or more and a substrate bias of 400 W or more will result in a tantalum barrier layer at least about 120 Angstroms thick on the substrate. In another example, similar conditions may be used to deposit a tantalum barrier layer 500-1000 Angstroms thick on a substrate having openings about 10 µm wide with less than about 4 minutes of processing.

Figure 4:
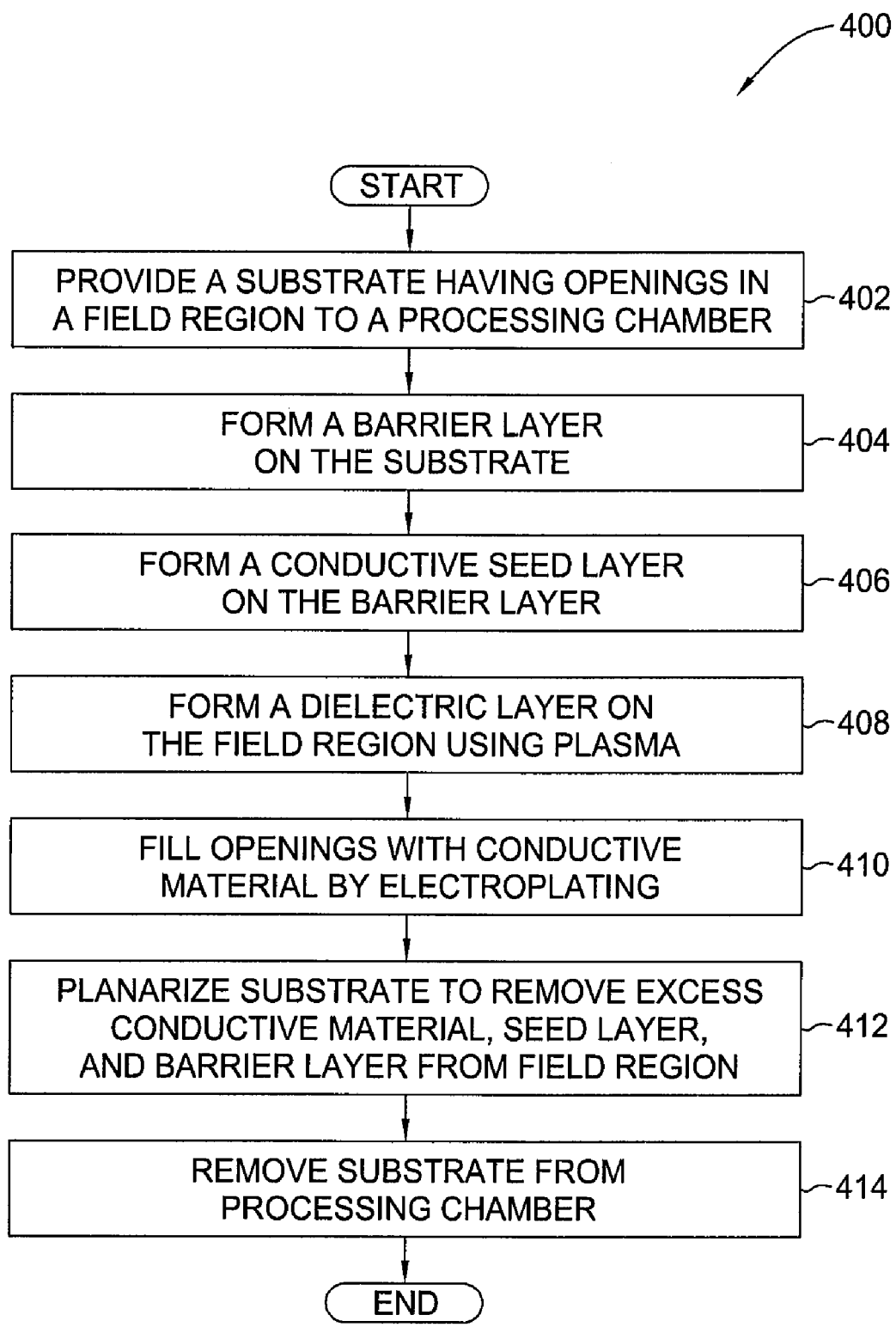
FIG. 4 is a process flow diagram according to another embodiment of the invention.
Figure 4A:
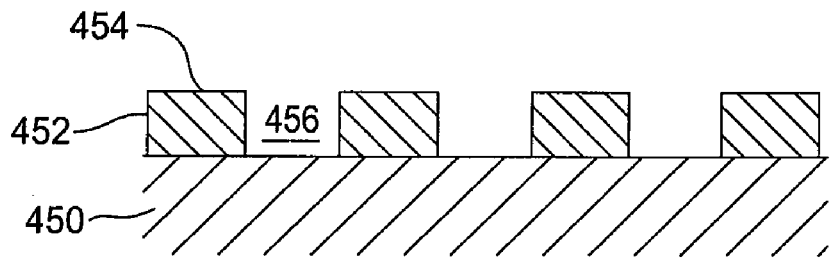
FIGS. 4A-4F are side views of a substrate in various stages of the process of FIG. 4.
Figure 4B:
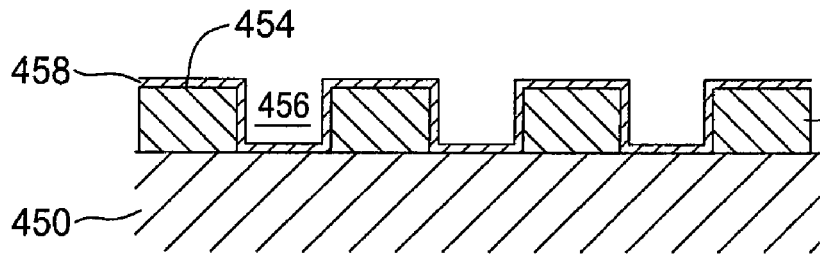
Figure 4C:
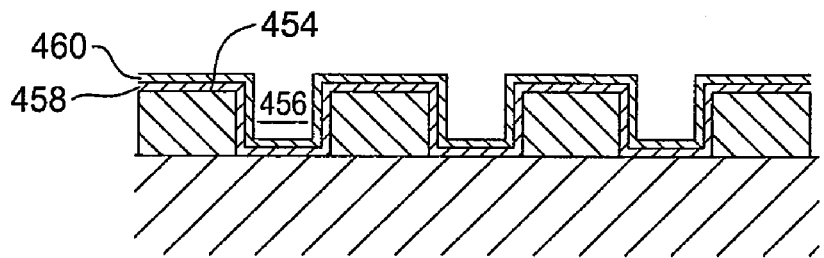

Following formation of the barrier layer, a conductive seed layer 460 is formed in step 406. The resulting structure is illustrated in FIG. 4C. The seed layer 460 is generally formed over the barrier layer 458 by any suitable process adapted to deposit conformally on the field region 454 and the sidewalls and bottoms of openings 456. Sputtering may similarly be used to deposit a conductive seed layer. Atoms are ejected by collision with energetic ions and deposit conformally on the substrate. For substrates having narrow openings, such as less than about 100 nm in width, the seed layer is generally thin, for example less than about 1000 Angstroms, such as about 600 Angstroms. For substrates having wider openings, such as about 10 µm, the seed layer may be thicker, if desired, such as up to about 500 nm. The seed layer is generally formed from a conductive material, such as copper or aluminum, or an alloy of metals such as copper, aluminum, zinc, silver, titanium, tantalum, nickel, or other metals.

Figure 4D:
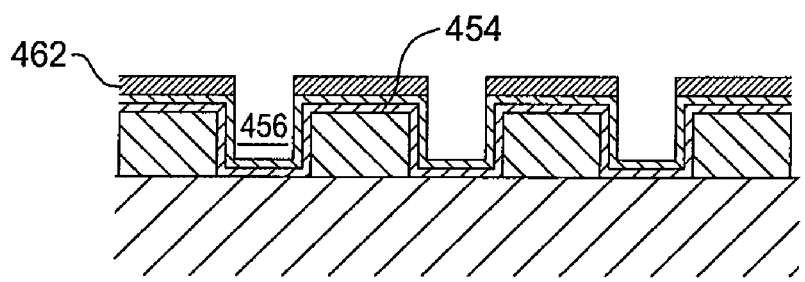

A dielectric layer is formed on the portion of the seed layer covering the field region in step 408. The resulting structure is illustrated in FIG. 4D. Dielectric layer 462 is formed to cover the portion of seed layer 460 formed on the field region 454. The seed layer covering sidewalls and bottoms of openings 456 is left exposed to the electroplating process to come. The dielectric layer may be formed by a semiconductor precursor, or a mixture thereof, and a second precursor may be an oxygen-containing compound, a nitrogen-containing compound, a boron-containing compound, a phosphorus-containing compound, a carbon-containing compound, or a mixture of these. The first and second precursors generally react under RF power to produce a dielectric layer on the substrate. The precursors may be provided to the process chamber in pulses, if desired.

In another aspect, embodiments of the invention provide a method of processing a substrate having openings and field regions, comprising depositing a barrier layer over the openings and field regions, depositing a seed layer over the openings and field regions, forming a resistive layer on the portion of the seed layer deposited over the field regions, filling the openings with a conductive material by an electroplating process, and planarizing the substrate. FIG. 4 is a process flow diagram illustrating a process 400 according to another embodiment of the invention. A substrate having openings in a field region is disposed on a substrate support in a processing chamber in step 402. FIG. 4A is a schematic diagram of such a substrate, having a first layer 450 and a second layer 452, wherein the second layer 452 has field regions 454 and openings 456 formed therein. First layer 450 and second layer 452 may each be conductive, non-conductive, or semi-conductive.

A barrier layer 458 is formed over the substrate in step 404. The resulting structure is illustrated in FIG. 4B. The barrier layer will generally be conformal, covering field region 454 and sidewalls and bottoms of openings 456. The barrier layer may be any material with suitable barrier properties, such as a metal-containing layer. Some exemplary barrier materials are tantalum (Ta) and tantalum nitride (TaN). The thickness of the barrier layer will depend on the geometry of the openings being filled and the needs of the application. For substrates having high aspect ratio geometry, with narrow, deep openings, the barrier layer may be thick relative to the size of the opening, so a 100 nm wide opening may have a barrier layer 20 nm thick deposited thereon. If the 100 nm wide opening is not deep, the barrier layer may be thin, for example less than 10 nm. In cases with openings that plasma-enhanced deposition process, such as plasma sputtering a dielectric target, reactive sputtering, or plasma-enhanced chemical vapor deposition. In some embodiments, the plasma process may be performed by applying RF power to an electrode to generate an electric field inside the process chamber. In other embodiments, a remote plasma may be generated by RF or microwave power applied to a precursor by an electrode. In some embodiments, RF power up to about 5000 W, such as about 2000 W, may be applied to generate the plasma. The plasma may be a reactive plasma, such as a plasma formed from one or more precursors in a chemical vapor deposition or reactive sputtering process, or a non-reactive plasma, such as a plasma formed from a non-reactive gas in a sputtering process. In one embodiment, argon gas is provided to the process chamber at a flow rate of about 10 to about 40 sccm and ionized by applying about 1 kilowatts (kW) to about 3 kW, such as about 2 kW of power. Under such conditions, and at a pressure of less than about 100 mTorr, preferably less than about 10 mTorr, such as about 4 mTorr, an aluminum oxide target may be bombarded for less than 25 seconds, such as about 18 seconds, to deposit a dielectric film at least 10 Angstroms thick on the field region of a patterned substrate, leaving the sidewalls and bottoms of the openings exposed.

In another embodiment, a reactive gas, such as oxygen or nitrogen gas or another oxygen or nitrogen compound, may be provided with the argon in a gas mixture, and a metal target such as aluminum used for the sputtering target. The reactive gas may also be provided in a ratio of about 0.5 to about 5.0 by volume compared to the argon. In still other embodiments, a hydrocarbon precursor may be provided to the chamber to deposit a polymer layer on the substrate.

In some embodiments, the dielectric layer may be etched after depositing on the field region. For example, traces of dielectric material may deposit in the bottoms of openings. An etching process may be used to remove this material, at the same time thinning the dielectric layer deposited on the field region. For this reason, in some embodiments, the dielectric layer is deposited slightly thicker than needed, such that an etching process may be employed to remove any dielectric from the openings without removing it from the field region. Any process known to etch dielectric materials may be used, such as physical or chemical plasma etching. For example, a plasma of nitrogen-containing and fluorine-containing gases may be used to etch an oxide or nitride dielectric material. Some exemplary gases that may be used in such a process are nitrogen trifluoride ($NF_3$), nitrogen ($N_2$), and lower fluorocarbons such as carbon tetrafluoride ($CF_4$). In some embodiments, a light etching may be advantageous. A low power plasma, for example an inductively coupled plasma powered by less than 1000 watts, or a plasma of reactive compounds carried in a non-reactive carrier gas, such as argon or helium, may be useful in a post-deposition plasma treatment or etching process.

In other embodiments, a non-reactive plasma, such as an argon plasma, may be used to etch the layer. Argon may be provided to a processing chamber containing a substrate to be etched. The argon may be energized into a plasma by application of less than about 3000 W of RF power, and a bias power of less than 1000 W applied to the substrate under pressure less than about 10 mTorr to etch the layer in 10 seconds or less.

Figure 4E:
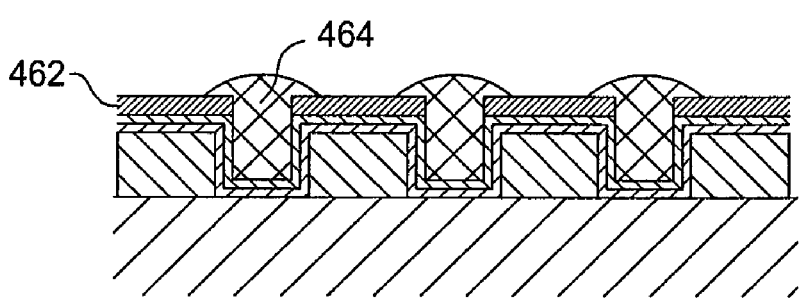
Figure 4F:
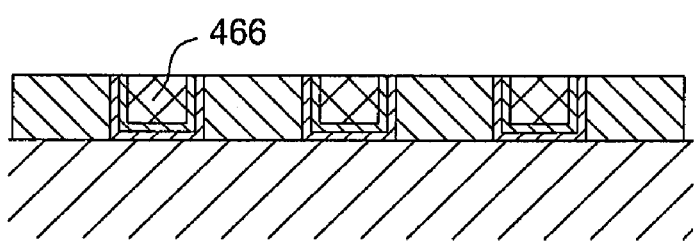

In step 410, the substrate is exposed to an electrolyte solution, and a voltage applied, to deposit conductive material thereon. The dielectric layer deposited on the field region in the previous step slows or prevents deposition on the field. A thick dielectric layer of high resistivity may prevent deposition in some cases, whereas a thin layer, or a layer of merely elevated resistivity may slow the initial deposition rate enough to allow the openings to fill with conductive material before overhang blocks access to the openings. FIG. 4E illustrates the resulting structure. The dielectric layer 462 has prevented electrochemical deposition on the field, and openings 456 have filled with conductive material to form feature 464. Because deposition on the field has been prevented, overfilling and excess metal laydown is minimized. Following formation of the feature, the substrate is subjected to a planarizing process in step 412, resulting in a substrate schematically represented by FIG. 4F. The barrier layer 458, seed layer 460, dielectric layer 462 and overfill have been removed, leaving finished features 466, such as vias and interconnects. The features 466 are void-free because dielectric layer 462 prevented growth of overhang from field region 454. The substrate is then removed from the process chamber in step 414.

Figure 5:
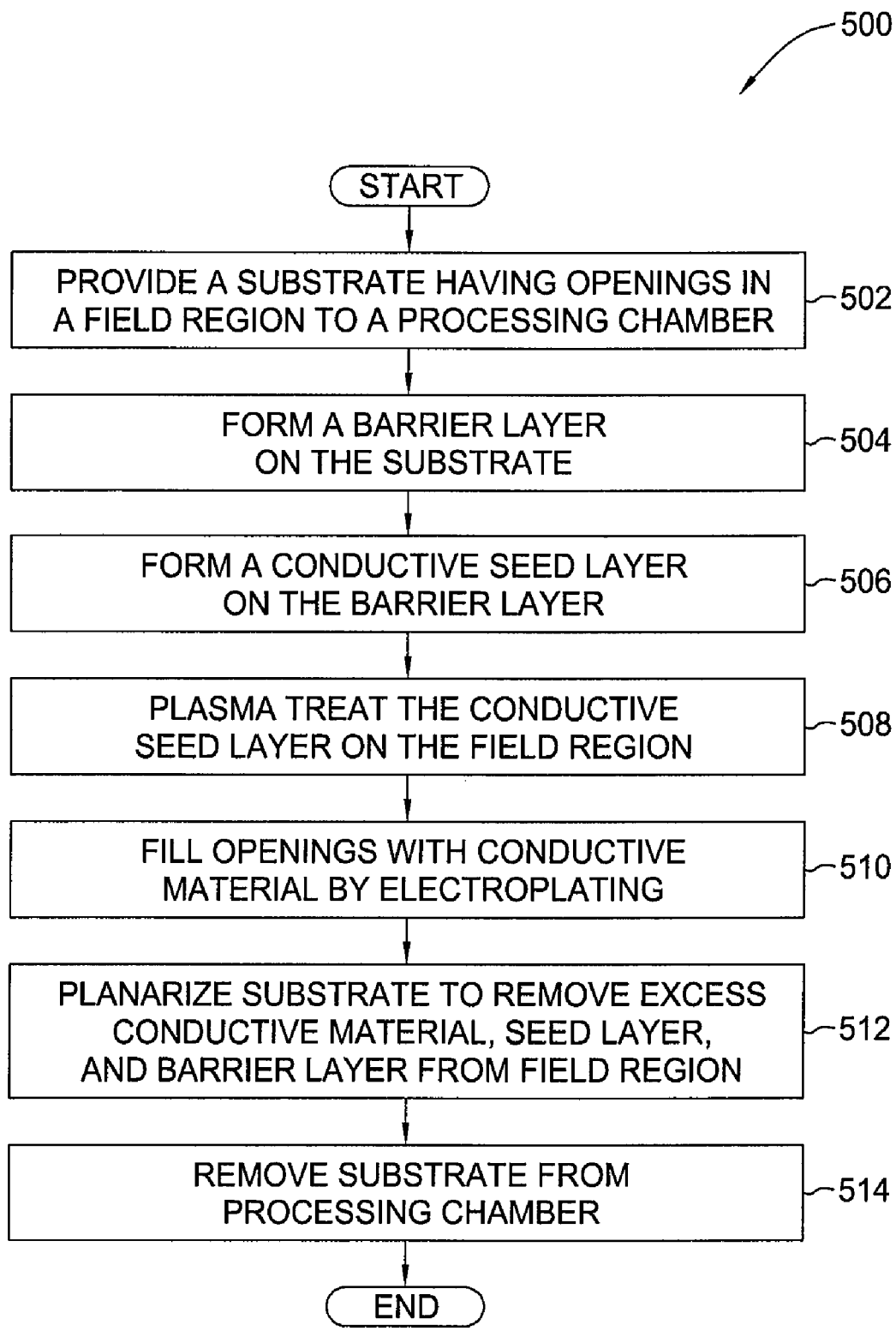
FIG. 5 is a process flow diagram according to another embodiment of the invention.
Figure 5A:
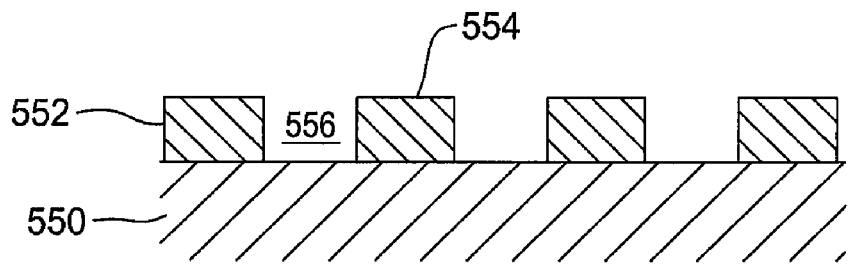
FIGS. 5A-5F are side views of a substrate in various stages of the process of FIG. 5.
Figure 5B:
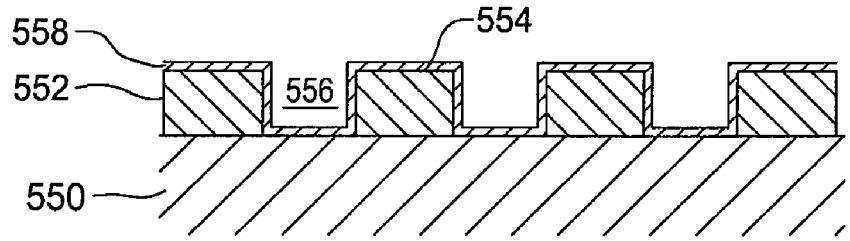
Figure 5C:
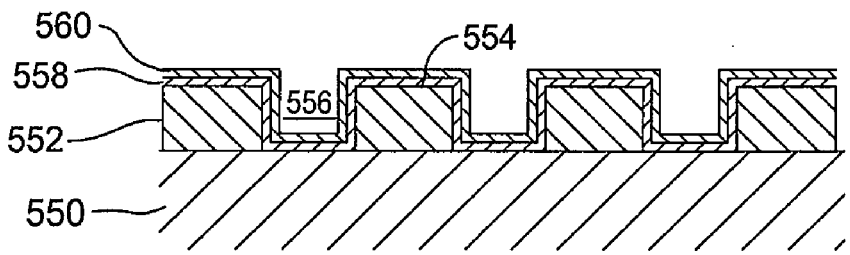
Figure 5D:
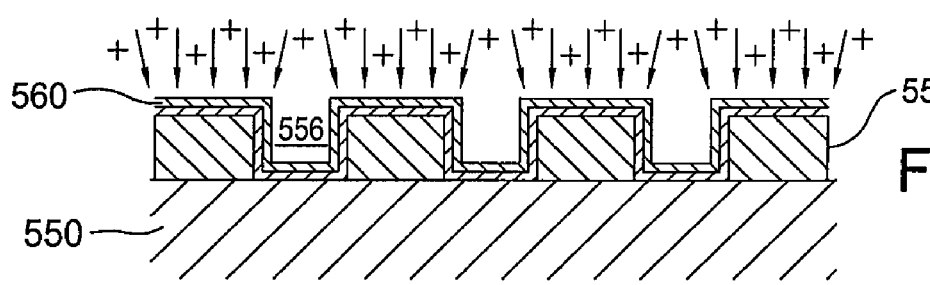

FIG. 5 is a process flow diagram describing a process 500 according to another embodiment of the invention. In this embodiment, a substrate is provided to a processing chamber (step 502), and a barrier layer and seed layer are formed (steps 504, 506) as described above. The substrate is represented at each of these stages by FIGS. 5A-5C. Substrate 550 has a patterned layer 552 formed thereon, with field regions 554 and openings 556. A barrier layer 558 and a seed layer 560 are conformally deposited over the surface in processes similar to those described herein. The seed layer may be subjected to a plasma treatment in step 508 to modify the surface of the seed layer deposited on the field region of the substrate. Plasma treatment, as depicted in FIG. 5D, will render the seed layer 560 less platable on the field region 554 than on the sidewalls and bottoms of the openings 556, such that the initial deposition rate during electroplating is faster in the openings and slower on the field. The plasma treatment changes the chemical potential of the seed layer on the field regions, giving the field region surface a different chemical potential from the sidewall and bottom surfaces of the openings.

Treating the seed layer 560 with a plasma selectively modifies the surface of the seed layer deposited on the field regions 554, without modifying the surface in the openings 556. The surface of the seed layer 560 may be modified by implanting a shallow layer of dopants, such as argon, oxygen, or nitrogen, into the surface to reduce its conductivity, or merely by disrupting (eg. amorphizing) the crystal structure at the surface. Dopants may be implanted in a thin layer at the surface of the seed layer. A layer of thickness less than about 10 Angstroms will be effective to retard initial deposition of conductive material on the field during electroplating. A single monolayer of thickness about 2 Angstroms or less may likewise be effective.

Figure 5E:
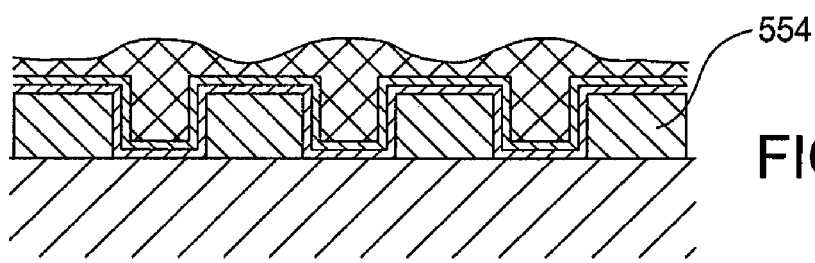
Figure 5F:
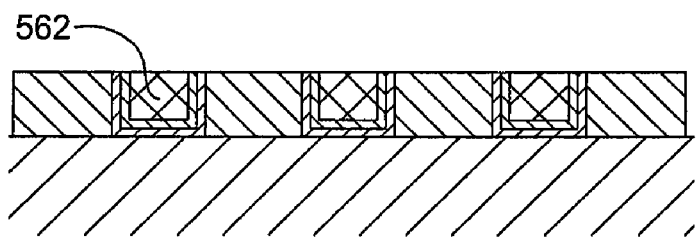

Following plasma treatment, openings are filled with conductive material by electroplating in step 510, resulting in a substrate such as that illustrated in FIG. 5E. Plating on field region 554 is reduced by treatment of the seed layer 560 in those regions. The presence of a thin layer with different chemical potential at the surface on the field regions results in the field region being less platable than surfaces in the openings, so the initial rate of deposition is slower on the field than in the openings. Subsequent planarization in step 512 removes barrier layer 558 and seed layer 560 from field regions 554, and removes excess metal, leaving flat, void-free features 562.

Figure 6:
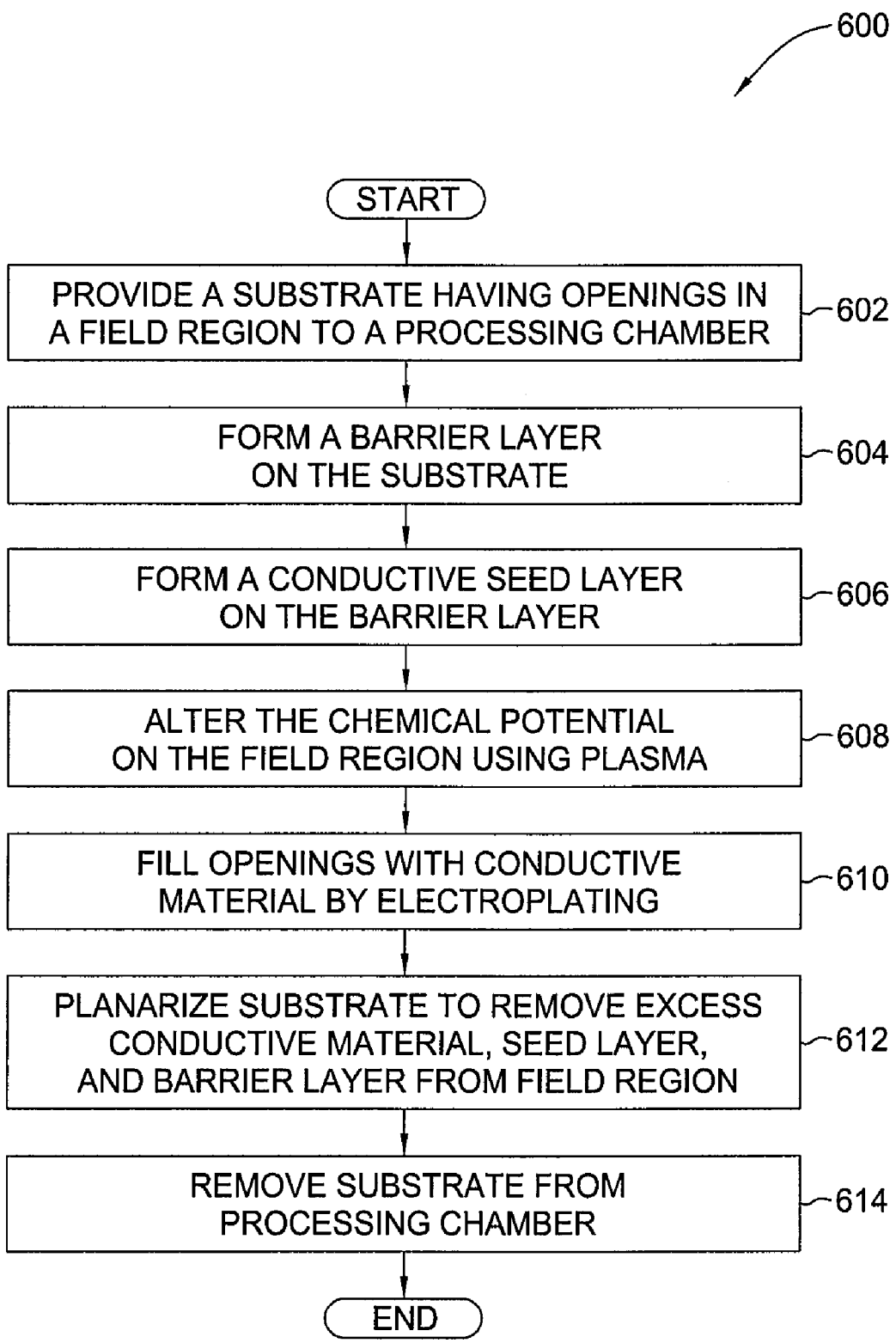
FIG. 6 is a process flow diagram according to another embodiment of the invention.
Figure 6A:
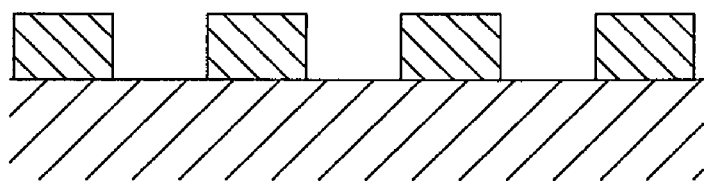
FIGS. 6A-6F are side views of a substrate in various stages of the process of FIG. 6.
Figure 6B:
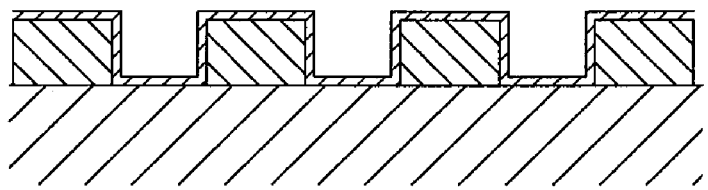
Figure 6C:
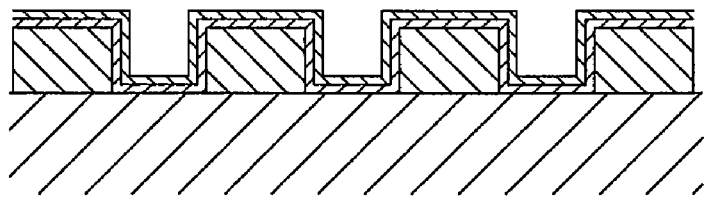
Figure 6D:
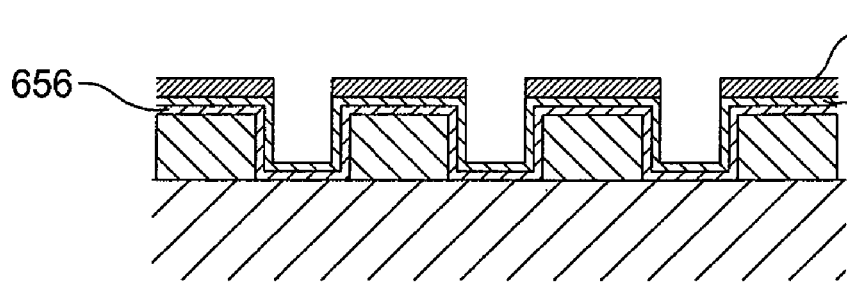
Figure 6E:
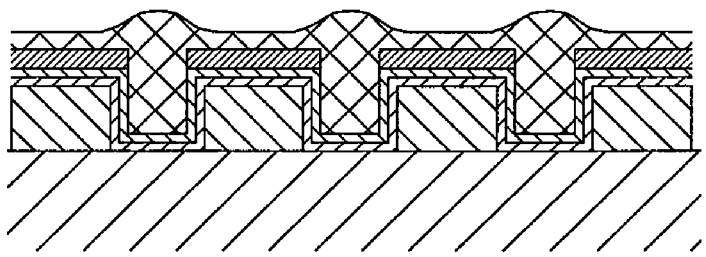
Figure 6F:
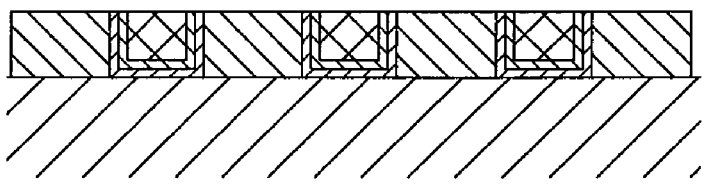

FIG. 6 is a process flow diagram illustrating a process according to another embodiment of the invention. In this process, step 608 features deposition of a layer 650 on the field region, covering the seed layer 652, as illustrated in FIG. 6D. The layer 650 may be a dielectric layer, or it may be a layer with lower conductivity or different chemical potential than the seed layer 652 exposed in the openings 654. For example, materials like tantalum, aluminum, and titanium may be used to change the chemical potential on the field regions. Alloys of copper may also be used, so long as the chemical potential of the deposited layer is different from that of the seed layer 652. Deposition of the layer 650 is by a plasma-assisted process, to ensure treatment of the field region 656 only, without treating the openings 654. Changing the chemical potential of the field region surface relative to the seed layer slows the initial rate of deposition during an electroplating process. Plating on the field is reduced, and void formation is prevented.

In another embodiment, formation of the seed layer may be by use of a sputtering target comprising an alloy of copper with lighter elements such as aluminum or boron. Lighter elements have more difficulty penetrating trenches because they have less momentum when accelerated by an electrical bias. Thus, they deposit preferentially on the field region, resulting in a different chemical potential on the field region than in the openings. In other embodiments, a target comprising an alloy of copper with elements having high ionization potential, such as tantalum or titanium, may be used for sputtering a seed layer. Elements with higher ionization potentials are more difficult to ionize, and are thus less affected by the electrostatic force of the bias applied to the substrate. Because they are not accelerated strongly by the voltage bias, they do not penetrate the openings substantially, but adhere preferentially to the field region, resulting in different chemical potential on the field than on the sidewalls or bottoms of the openings. These embodiments have the advantage that the seed layer is modified in a beneficial way at the same time it is formed.

While the foregoing is directed to embodiments of the present invention, other and further embodiments of the invention may be devised without departing from the basic scope thereof, and the scope thereof is determined by the claims that follow.

The invention claimed is:

1. A method of processing a patterned substrate having a field region and openings in the field region, comprising:
    forming a conductive seed layer on the field regions and openings;
    forming one or more dielectric layers comprising nitrogen, oxygen, or both in the presence of RF power only on portions of the conductive seed layer formed on the field region, leaving exposed regions of the conductive seed layer in the openings; and
    depositing a conductive material on the exposed regions of the conductive seed layer in at least some of the openings by an electroplating process.

2. The method of claim 1, further comprising removing the one or more dielectric layers in a planarization process.

3. The method of claim 2, further comprising forming the conductive seed layer over a barrier layer.

4. The method of claim 1, further comprising etching a portion of the one or more dielectric layers.

5. The method of claim 1, wherein the one or more dielectric layers comprises a metal-containing layer.

6. The method of claim 5, wherein the metal-containing layer is a metal oxide layer.

7. The method of claim 5, wherein the metal-containing layer comprises tantalum, aluminum, titanium, or combinations thereof.

8. A method of processing a substrate having openings and field regions, comprising:
    depositing a barrier layer over the openings and field regions;
    depositing a seed layer over the openings and field regions;
    forming a resistive layer comprising nitrogen, oxygen, or both by a vapor deposition process only on the portion of the seed layer deposited over the field regions, leaving exposed regions of the seed layer in the openings;
    filling the openings with a conductive material by an electroplating process; and
    planarizing the substrate.

9. The method of claim 8, wherein forming the resistive layer on the portion of the seed layer deposited over the field regions comprises exposing the seed layer to a gas in the presence of RF power.

10. The method of claim 9, wherein the gas is selected from the group consisting of argon, oxygen, nitrogen, helium, a metal compound, a carbon compound, a boron compound, a phosphorus compound, and combinations thereof.

11. The method of claim 8, wherein the resistive layer has a resistivity higher than the seed layer.

12. The method of claim 8, wherein the resistive layer comprises a metal.

13. The method of claim 12, further comprising etching at least a portion of the resistive layer.

14. The method of claim 12, wherein the resistive layer comprises an oxide.

15. A method of filling one or more openings formed in a field region of a substrate with a conductive material, comprising:
    forming a conductive layer over the openings and field region;
    depositing an insulating layer only on the field region by a plasma process;
    removing a portion of the insulating layer from the field region;
    filling at least a portion of the one or more openings with conductive material by exposing at least a portion of the substrate to an electrolyte solution; and
    planarizing the substrate.

16. The method of claim 15, wherein the insulating layer is selectively deposited on the field region.

17. The method of claim 15, wherein depositing the insulating layer on the field region in the presence of RF power comprises providing one or more precursors to a processing chamber, ionizing at least a portion of the precursors, and reacting the precursors to form the insulating layer.

18. The method of claim 17, wherein removing a portion of the insulating layer comprises etching the substrate.

19. The method of claim 1, wherein forming the one or more dielectric layer comprising nitrogen, oxygen, or both on portions of the conductive seed layer formed on the field region comprises incorporating nitrogen, oxygen, or both in a surface of the conductive seed layer formed on the field region.

20. The method of claim 8, wherein forming the resistive layer comprising nitrogen, oxygen, or both on the portion of the seed layer deposited over the field regions comprises implanting nitrogen, oxygen, or both in a surface of the seed layer deposited over the field regions.

* * * * *